(12) United States Patent
Hishida et al.

(10) Patent No.: US 8,159,068 B2
(45) Date of Patent: Apr. 17, 2012

(54) SEMICONDUCTOR DEVICE

(75) Inventors: Takeshi Hishida, Kanagawa (JP);
Tsutomu Igarashi, Kanagawa (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 291 days.

(21) Appl. No.: 12/647,213

(22) Filed: Dec. 24, 2009

(65) Prior Publication Data

US 2010/0164103 A1    Jul. 1, 2010

(30) Foreign Application Priority Data

Dec. 26, 2008  (JP) ................................ 2008-332454

(51) Int. Cl.
*H01L 23/48* (2006.01)
*H01L 23/52* (2006.01)

(52) U.S. Cl. ........ 257/745; 257/767; 257/768; 257/770; 257/E23.134; 257/E21.168

(58) Field of Classification Search .................. 257/745, 257/767–770, E23.134, E21.168
See application file for complete search history.

(56) References Cited

U.S. PATENT DOCUMENTS

| 5,121,174 | A | * | 6/1992 | Forgerson et al. ............ 257/271 |
| 5,652,434 | A | * | 7/1997 | Nakamura et al. ............. 257/13 |
| 5,923,072 | A | * | 7/1999 | Wada et al. .................... 257/473 |
| 6,946,685 | B1 | * | 9/2005 | Steigerwald et al. ........... 257/94 |
| 7,109,529 | B2 | * | 9/2006 | Uemura et al. ................. 257/99 |
| 7,436,066 | B2 | * | 10/2008 | Sonobe et al. ................ 257/767 |
| 7,800,116 | B2 | * | 9/2010 | Murata et al. .................... 257/76 |
| 2003/0052328 | A1 | * | 3/2003 | Uemura ........................ 257/103 |
| 2008/0054457 | A1 | * | 3/2008 | Lin et al. ....................... 257/737 |

FOREIGN PATENT DOCUMENTS

JP          05-129430 A    5/1993

* cited by examiner

*Primary Examiner* — Nitin Parekh
(74) *Attorney, Agent, or Firm* — Westerman, Hattori, Daniels & Adrian, LLP

(57) ABSTRACT

A semiconductor device includes: a semiconductor layer composed of one of GaAs based semiconductor, InP-based semiconductor, and GaN-based semiconductor; a first silicon nitride film that is provided on the semiconductor layer, and of which an end portion is in contact with a surface of the semiconductor layer; a protective film that is composed of one of polyimide and benzocyclobutene, and is provided on the semiconductor layer and the first silicon nitride film, the protective film covering the end portion of the first silicon nitride film; and a first metallic layer that is composed of one of titanium, tantalum and platinum, and is continuously provided from a first portion located between the semiconductor layer and the protective film to a second portion located between the end portion of the first silicon nitride film and the protective film, the first metallic layer being in contact with the surface of the semiconductor layer and a surface of the end portion of the first silicon nitride film.

6 Claims, 6 Drawing Sheets

SEMICONDUCTOR DEVICE

CROSS-REFERENCE TO RELATED APPLICATION

This application is based upon and claims the benefit of priority of the prior Japanese Patent Application No. 2008-332454, filed on Dec. 26, 2008, the entire contents of which are incorporated herein by reference.

BACKGROUND (i) Technical Field

A certain aspect of the embodiments discussed herein is related to a semiconductor device, especially related to a semiconductor device where a protective film is provided on a semiconductor layer.

(ii) Related Art

A protective film composed of an insulating material such as a silicon nitride (SiN) may be provided on the surface of a semiconductor layer to protect the semiconductor layer of a semiconductor device from stress and fouling. Also, a protective film may be provided to protect the top surface of a semiconductor device in the molding process.

Japanese Laid-Open Patent Publication No. 5-129430 (hereinafter referred to as Document 1) discloses a technique to suppress the exfoliation of a protective film by forming a metallic film at the boundary between the protective film and a scribe line.

However, moisture may penetrate from the boundary between a semiconductor layer and a protective film, and corrode an electrode.

For example, in FIG. 1 of Document 1, if a protective film is a polyimide layer, the exfoliation of the protective film can be suppressed because a metallic film provided at outmost side covers the end portion of the protective film. However, since polyimide has low resistance to moisture penetration, moisture penetrating through the protective film may reach an external lead electrode, and corrode the external lead electrode.

SUMMARY

The present invention has been made in view of the above circumstances and aims to suppress reliability degradation of a semiconductor device caused by moisture penetration.

According to an aspect of the present invention, there is provided a semiconductor device including: a semiconductor layer composed of one of GaAs-based semiconductor, InP-based semiconductor, and GaN-based semiconductor; a first silicon nitride film that is provided on the semiconductor layer, and of which an end portion is in contact with a surface of the semiconductor layer; a protective film that is composed of one of polyimide and benzocyclobutene, and is provided on the semiconductor layer and the first silicon nitride film, the protective film covering the end portion of the first silicon nitride film; and a first metallic layer that is composed of one of titanium, tantalum and platinum, and is continuously provided from a first portion located between the semiconductor layer and the protective film to a second portion located between the end portion of the first silicon nitride film and the protective film, the first metallic layer being in contact with the surface of the semiconductor layer and a surface of the end portion of the first silicon nitride film.

BRIEF DESCRIPTION OF THE DRAWINGS

Other objects, features and advantages of the present invention will become more apparent from the following detailed description when read in conjunction with the accompanying drawings, in which.

DETAILED DESCRIPTION

A description will now be given, with reference to the accompanying drawings, of exemplary embodiments of the present invention.

First Embodiment

Figure 1A:
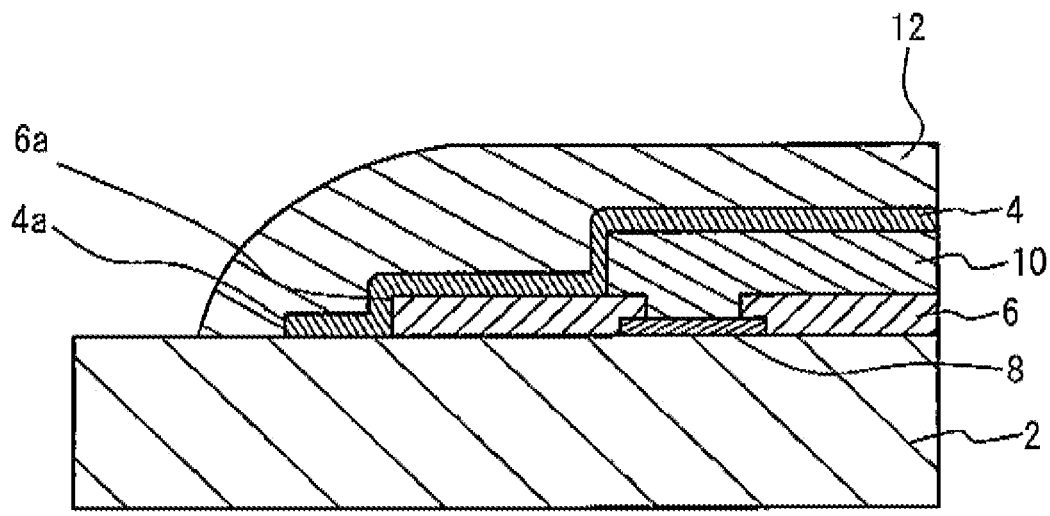
FIG. 1A is a cross section diagram illustrating a semiconductor device in accordance with a comparative example.

Before the description of the embodiment is given, the description will be given of a comparative example. FIG. 1A is a cross section diagram illustrating the vicinity of an end portion of a semiconductor device in accordance with the comparative example. The end portion of the semiconductor device is a region separated by scribe lines, for example.

As illustrated in FIG. 1A, a first silicon nitride film 4 having a thickness of 600 nm is provided on a semiconductor layer 2 composed of GaAS, and a thickness of 30 μm, as a film to protect the semiconductor layer 2, for example. A second silicon nitride film 6 having a thickness of 1 μm is provided between the semiconductor layer 2 and the first silicon nitride film 4, for example. An end portion 4a of the first silicon nitride film 4 and an end portion 6a of the second silicon nitride film 6 are located on the semiconductor layer 2. In addition, the end portion 6a of the second silicon nitride film 6 is covered with the first silicon nitride film 4. An ohmic electrode 8 composed of a metal such as AuGe, and a thickness of 400 nm is provided on the semiconductor layer 2, for example. The second silicon nitride film 6 has an opening portion exposing at least a part of the upper surface of the ohmic electrode 8. In addition, an electrode pad 10 composed of a metal such as Au is provided on the ohmic electrode 8 so as to be coupled to the ohmic electrode 8 electrically. This means that the electrode pad 10 is provided between the semiconductor layer 2 and the first silicon nitride film 4. A polyimide layer 12 (a protective film) is provided on the semiconductor layer 2 and the first silicon nitride film 4 to cover the end portion 4a of the first silicon nitride film 4. The distance from the end portion of the polyimide layer 12 to the end portion 4a of the first silicon nitride film 4 is 3 μm for example, the distance from the end portion of the polyimide layer 12 to the end portion 6a of the second silicon nitride film 6 is 4 μm for example, and the distance from the end portion of the polyimide layer 12 to the ohmic electrode 8 is 12 μm for example.

Figure 1B:
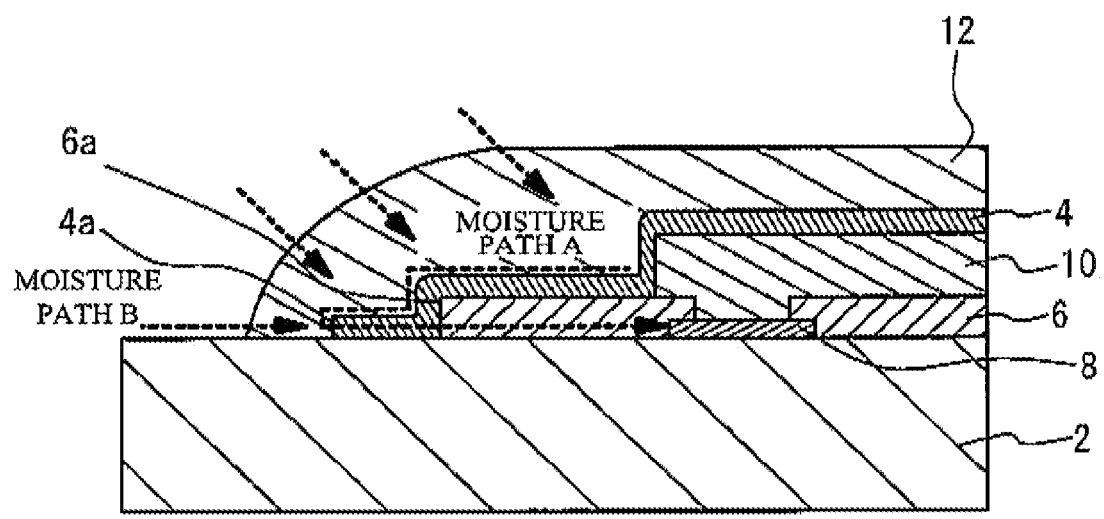
FIG. 1B is a cross section diagram illustrating exemplary moisture penetration.

FIG. 1B is a cross section diagram illustrating a case where moisture penetrates into the semiconductor device in the comparative example. The description will be given of a moisture path A first. As illustrated with arrows in FIG. 1B, since polyimide has low resistance to moisture penetration, moisture near the semiconductor device penetrates through the polyimide layer 12, and reaches the surface of the first silicon nitride film 4. Since the silicon nitride has relatively high resistance to moisture penetration, moisture penetrating through the polyimide layer 12 does not penetrate through the first silicon nitride film 4, and is collected at the boundary between the polyimide layer 12 and the first silicon nitride film 4. The first silicon nitride film 4 contacts the polyimide layer 12, but the adhesion between the silicon nitride and the polyimide is low, and the polyimide layer 12 covers the first silicon nitride film 4. Therefore, moisture collected at the boundary between the first silicon nitride film 4 and the polyimide layer 12 may move along the boundary, and reach the end portion 4a of the first silicon nitride film 4. Now the description will be given of a moisture path B.

Although the semiconductor layer 2 contacts the polyimide layer 12, moisture may penetrate from the boundary between the semiconductor layer 2 and the polyimide layer 12, and reach the end portion 4a of the first silicon nitride film 4.

Moisture penetration from the moisture path A and the moisture path B may take place in the boundary between the semiconductor layer 2 and the first silicon nitride film 4, and the boundary between the semiconductor layer 2 and the second silicon nitride film 6, and reach the ohmic electrode 8. In this case, the ohmic electrode 8 is corroded with moisture that has penetrated. Especially, when the ohmic electrode 8 is wire-bonded to the electrode pad 10 which is on the ohmic electrode 8, the exfoliation of the corroded ohmic electrode 8 may happen because of stress applied to the wire. As described, moisture penetration degrades reliability of the semiconductor device.

Figure 2A:
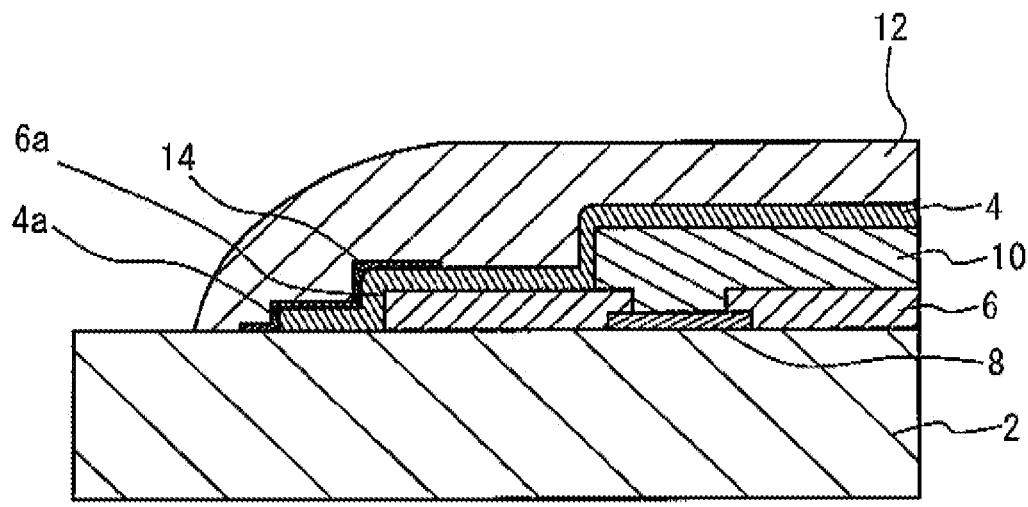
FIG. 2A is a cross section diagram illustrating a semiconductor device in accordance with a first embodiment.
Figure 2B:
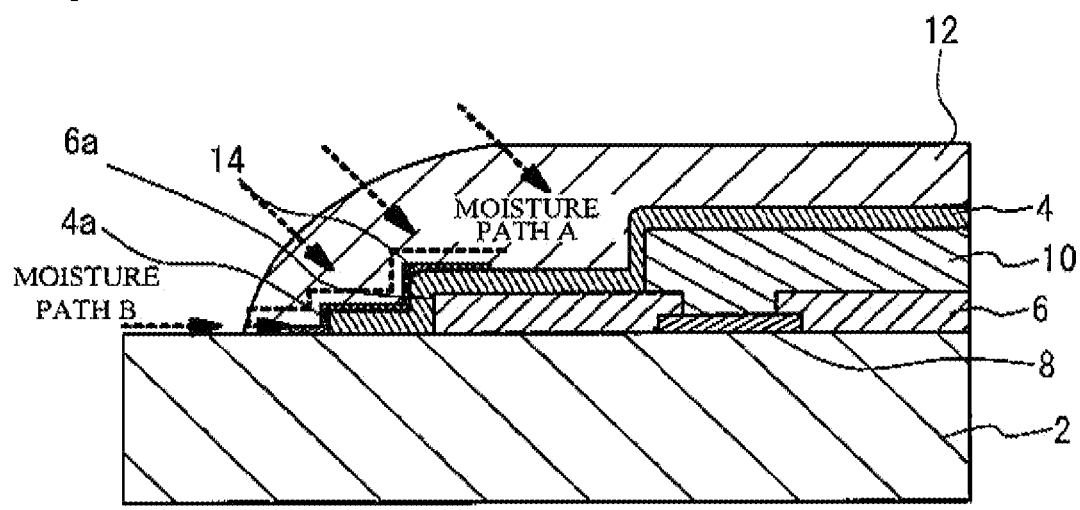
FIG. 2B is a cross section diagram illustrating exemplary moisture penetration.

FIG. 2A is a cross section diagram illustrating the semiconductor device in accordance with the first embodiment. FIG. 2B is a cross section diagram illustrating the moisture path in the semiconductor device in accordance with the first embodiment. Referring to FIG. 2A, the description will be given of the composition of the semiconductor device in accordance with the first embodiment. Here, a description of compositions that are the same as compositions already described in FIG. 1A is omitted.

As illustrated in FIG. 2A, in the semiconductor device in accordance with the first embodiment, a first Ti layer 14 (first metallic layer) having a thickness of 3 to 20 nm is sequentially provided from between the semiconductor layer 2 and the polyimide layer 12 to between the first silicon nitride film 4 and the polyimide layer 12, contacting the upper surface of the semiconductor layer 2 and the end portion 4a of the first silicon nitride film 4. The part of the first silicon nitride film 4 is in contact with the polyimide layer 12. Now, referring to FIG. 2S, the description will be given of the moisture path in the semiconductor device illustrated in FIG. 2A.

As illustrated with arrows in FIG. 2B, moisture penetrates into the polyimide layer 12 from outside, and moves along the boundary between the first silicon nitride film 4 and the polyimide layer 12 (the moisture path A), as with the example in FIG. 1B. However, the first Ti layer 14 is provided so as to contact the upper surface of the semiconductor layer 2 and the end portion 4a of the first silicon nitride film 4. Ti has high adhesion with GaAs-based semiconductor which forms the semiconductor layer 2 and the silicon nitride, and a good resistance to the corrosion by moisture. Therefore, it is possible to suppress the moisture penetration into the boundary between the semiconductor layer 2 and the first silicon nitride film 4 through the moisture path A. In addition, it is possible to suppress moisture penetration into the boundary between the semiconductor layer 2 and the first silicon nitride film 4 through the boundary between the semiconductor layer 2 and the polyimide layer 12 (the moisture path B) because of the presence of the first Ti layer 14.

More specifically, according to the first embodiment, moisture penetration into the boundary between the semiconductor layer 2 and the first silicon nitride film 4 is suppressed by providing the first Ti layer 14 between the polyimide layer 12 and the first silicon nitride film 4. This composition is greatly different from the art described in Document 1, where Ti is provided at the outmost side of the semiconductor device. Therefore, according to the first embodiment, the corrosion of the ohmic electrode 8 by moisture is suppressed, and the reliability of the semiconductor device can be enhanced.

Although the thickness of the first Ti layer 14 is not limited, it is preferable that the thickness is equal to or less than 20 nm in order to reduce level differences. If the thickness of the first Ti layer 14 is equal to or less than 15 nm, it is possible to reduce level differences further, and the thickness less than 10 nm is more preferable. It is preferable that the thickness of the first Ti layer 14 is equal to or greater than 3 nm in order to form the first Ti layer 14 easily. The first Ti layer 14 is sequentially provided from between the semiconductor layer 2 and the polyimide layer 12 to between the first silicon nitride film 4 and the polyimide layer 12, but is not necessarily provided to whole surface of the boundary between the first silicon nitride film 4 and the polyimide layer 12. Since Ti has conductive property, if the first Ti layer 14 extends to near the electrode pad 10, a short circuit may occur between the first Ti layer 14 and the electrode pad 10. To prevent the short circuit with the electrode pad 10, it is preferable that the first Ti layer 14 is provided to the part of the boundary between the first silicon nitride film 4 and the polyimide layer 12. That is to say that it is preferable to provide the first Ti layer 14 so that the part of the first silicon nitride film 4 contacts with the polyimide layer 12. In addition, it is preferable that the first silicon nitride film 4 is provided between the electrode pad 10 and the first Ti layer 14 so as to contact the electrode pad 10. If the first Ti layer 14 is sequentially provided from between the semiconductor layer 2 and the polyimide layer 12 to between the end portion 4a of the first silicon nitride film 4 and the polyimide layer 12, the suppressant effect on moisture penetration is achieved.

To suppress moisture penetration, a metal such as Pt and Ta, which has high adhesion with the semiconductor and the silicon nitride, can be used besides Ti. In addition, the layer can be formed with a metal such as Rn and Nb.

Although the semiconductor layer 2 is composed of GaAs in the first embodiment, other semiconductors that have high adhesion with Ti can be used for suppressing moisture penetration. It is preferable that the semiconductor layer is composed of GaAs-based semiconductor, InP-based semiconductor, GaN-based semiconductor, for example. GaAs-based semiconductor is a semiconductor including Ga and As, and is GaAs, InGaAs, and AlGaAs for example. InP-based semiconductor is a semiconductor including In and P, and is InP, InGaAsP, InAlGaP and InAlGaAsP for example. GaN-based semiconductor is a semiconductor including Ga and N, is GaN, InGaN, AlGaN, and InAlGaN for example.

Second Embodiment

Figure 3:
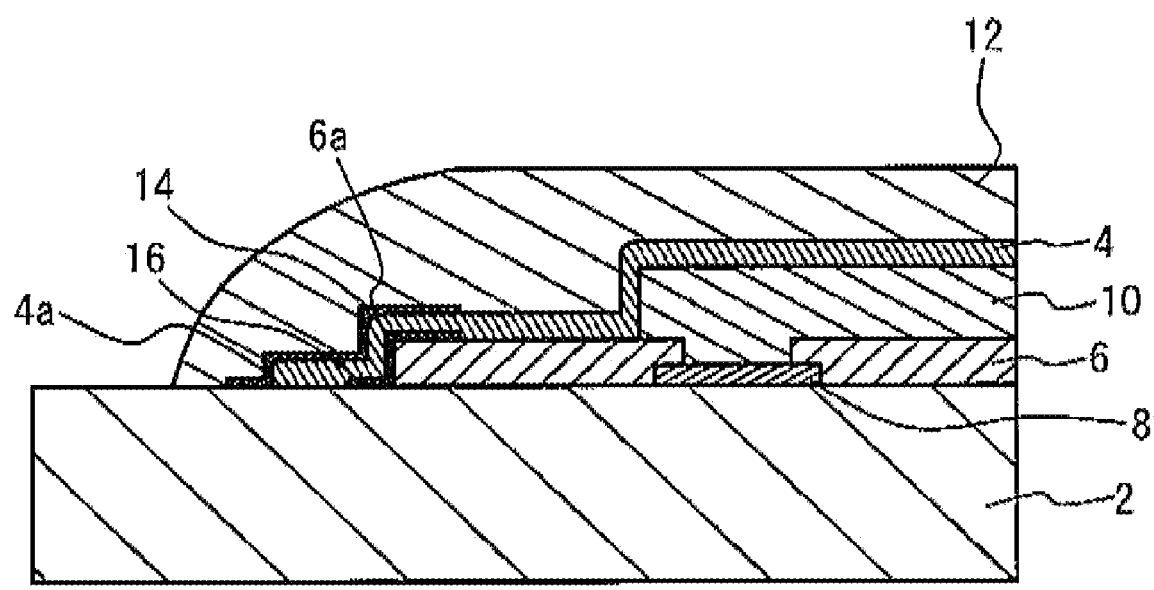
FIG. 3 is a cross section diagram illustrating a semiconductor device in accordance with a second embodiment.

The second embodiment is an example where a second Ti layer 16 is provided. FIG. 3 is a cross section diagram illustrating a semiconductor device in accordance with the second embodiment. A description of compositions same as compositions already described will be omitted.

As illustrated in FIG. 3, the second Ti layer 16 having a thickness of 3 to 20 nm for example is sequentially provided from between the semiconductor layer 2 and the first silicon nitride film 4 to between the first silicon nitride film 4 to the second silicon nitride film 6, contacting with the upper surface of the semiconductor layer 2 and the end portion 6a of the second silicon nitride film 6.

According to the second embodiment, even in the case that a defect such as a pinhole occurs in the first Ti layer 14 for example, the second Ti layer 16 suppresses moisture penetration. Therefore, the reliability of the semiconductor device can be enhanced more certainly.

Third Embodiment

Figure 4:
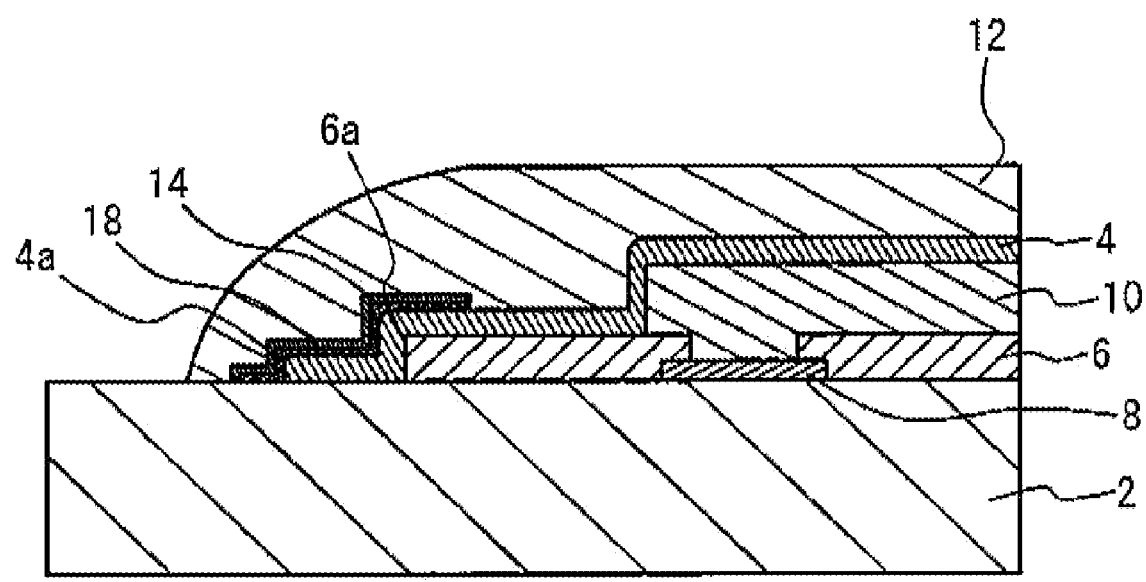
FIG. 4 is a cross section diagram illustrating a semiconductor device in accordance with a third embodiment.

The third embodiment is an example where an Au layer is provided on Ti. FIG. 4 is a cross section diagram illustrating a semiconductor device in accordance with the third embodiment. A description of compositions that are the same as compositions already described will be omitted.

As illustrated in FIG. 4, an Au layer 18, which may be formed with a plating method, and has a thickness of 4 μm, is provided on the first Ti layer 14, overlapping with the first Ti layer 14, for example. The Au layer 18 is in contact with the surface of the first Ti layer 14.

Ti has high resistance to etching. Accordingly, when a patterning to form the first Ti layer 14 is performed, a resist may be etched quicker than the first Ti layer 14, and the first Ti layer 14 can not be formed. In the fabrication process of the first Ti layer 14, the Au layer 18 is provided on the part which becomes the first Ti layer 14 with the plating method, and the first Ti layer 14 is formed by using the Au layer 18 as a mask. This enables the first Ti layer 14 to be formed.

According to the third embodiment, the first Ti layer 14 can be formed more reliably than the case that the resist is used, because the Au layer 18 is used as a mask. In addition, as illustrated in FIG. 4, the first Ti layer 14 can be protected because the Au layer 18 is provided on the first Ti layer 14.

In FIG. 4, the description is given of the example where the Au layer 18 is provided on the first Ti layer 14. However, same effect is achieved by providing the Au layer 18 on the second Ti layer 16 in FIG. 3. The Au layer 18 can be formed with methods other than the plating method. However, it is preferable to use the plating method because the Au layer 18 can be formed in arbitrary region on the first Ti layer 14.

Fourth Embodiment

Figure 5A:
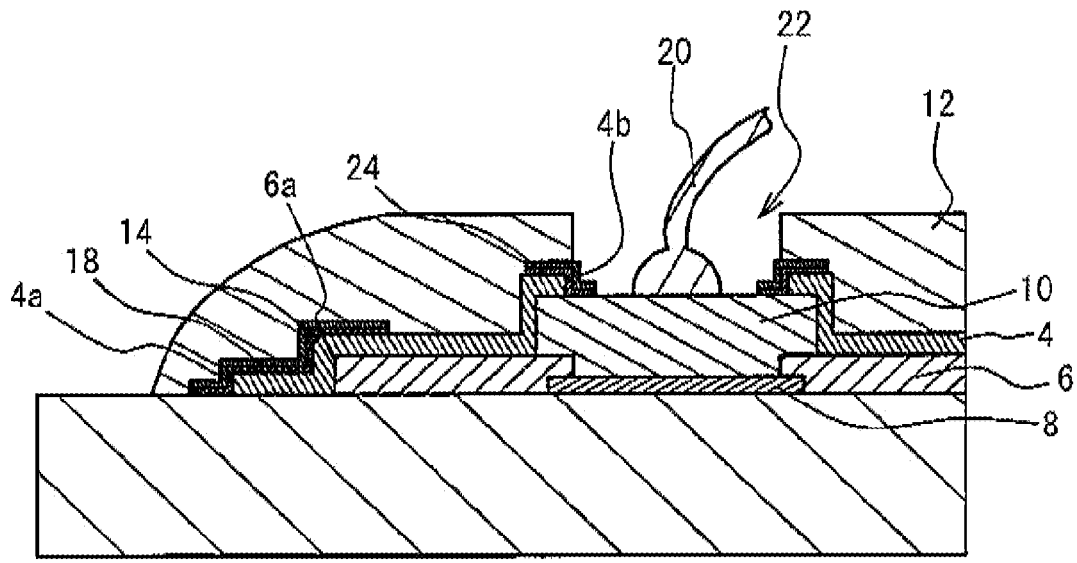
FIG. 5A is a cross section diagram illustrating a semiconductor device in accordance with a fourth embodiment.
Figure 5B:
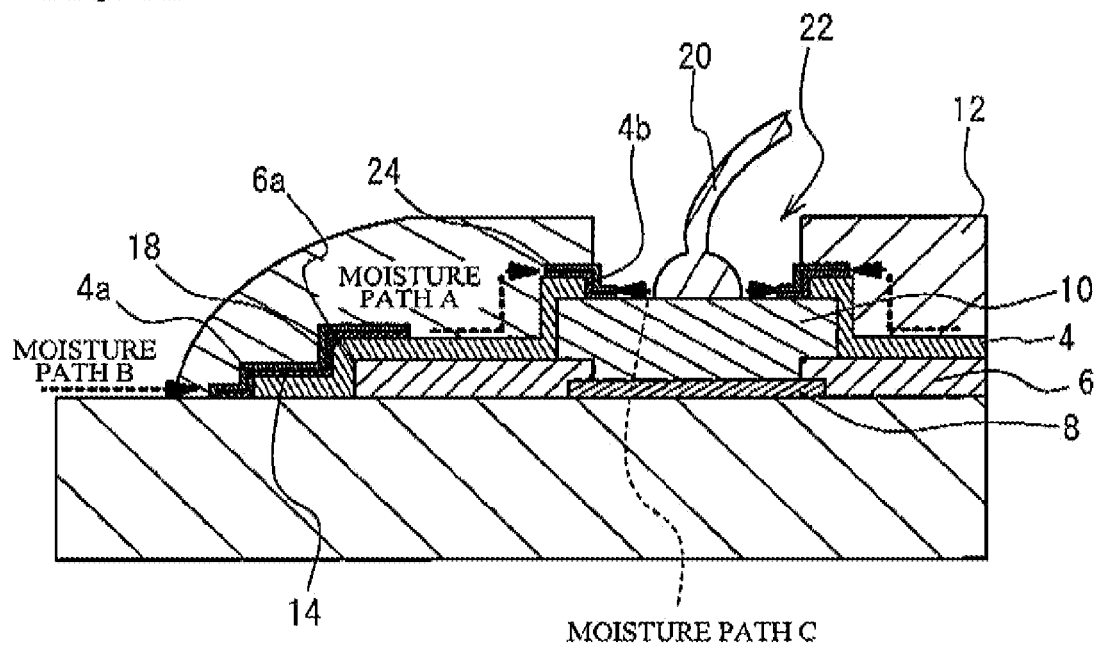
FIG. 5B is a cross section diagram illustrating exemplary moisture penetration.

The fourth embodiment is an example where a metallic layer is provided on an electrode pad. FIG. 5A is a cross section diagram illustrating a semiconductor device in accordance with the fourth embodiment. FIG. 5B is a cross section diagram illustrating a moisture path in the semiconductor device in accordance with the fourth embodiment. Referring to FIG. 5A, a description will be given of the composition of the semiconductor device in accordance with the fourth embodiment. A description of compositions that are the same as compositions already described will be omitted.

As illustrated in FIG. 5A, an opening portion 22 having a size of 80 μm×80 μm is formed in the first silicon nitride film 4 so that the upper surface of the electrode pad 10 is exposed, and another end portion 4b of the first silicon nitride film 4 is located on the electrode pad 10. A wire 20 composed of a metal such as Au is provided on the upper surface of the exposed electrode pad 10 so as to be coupled with the electrode pad 10 electrically. A third Ti layer 24 having a thickness of 3 to 20 nm (a third metallic layer) is in contact with the another end portion 4b of the first silicon nitride film 4 and the upper surface of the electrode pad 10, and is sequentially provided from the surface of the electrode pad 10 to between the first silicon nitride film 4 and the polyimide layer 12 so that the upper surface of the electrode pad 10 is exposed. In addition, the Au layer 18 is provided not only on the upper surface of the first Ti layer 14 but also on the upper surface of the third Ti layer 24 so as to overlap with the third Ti layer 24. The wire 20 is provided away from the third Ti layer 24 and the Au layer 18. This means that the wire 20 does not contact with the third Ti layer 24 and the Au layer 18. The distance between the wire 20 and the third Ti layer 24 is 10 μm for example. Now, referring to FIG. 5B, a description will be given of the moisture path in the semiconductor device in FIG. 5A.

As illustrated with arrows in FIG. 5B, moisture penetrating through the polyimide layer 12 from outside moves along the boundary between the first silicon nitride film 4 and the polyimide layer 12 (the moisture path A), as with the example described in FIG. 13. However, the third Ti layer 24 is provided between the first silicon nitride film 4 and the polyimide layer 12. Since Ti has high adhesion with Au composing the electrode pad 10, it is possible to suppress moisture penetration into the boundary between the first silicon nitride film 4 and the electrode pad 10 from the boundary between the first silicon nitride film 4 and the polyimide layer 12 through the another end portion 4b of the first silicon nitride film 4.

In addition, moisture may penetrate from the boundary between the semiconductor layer 2 and the polyimide layer 12 the moisture path B), as with the example in FIG. 1B. However, moisture penetration into the boundary between the semiconductor layer 2 and the first silicon nitride film 4 can be suppressed because the first Ti layer 14 is provided.

Furthermore, moisture may be collected on the upper surface of the electrode pad 10. When the first silicon nitride film 4 has low adhesion with the electrode pad 10, moisture may penetrate into the boundary between the first silicon nitride film 4 and the electrode pad 10, reach the ohmic electrode 8, and cause the corrosion (a moisture path. C). However, according to the fourth embodiment, moisture penetration into the boundary between the first silicon nitride film 4 and the electrode pad 10 can be suppressed because the third Ti layer 24 is provided in contact with the another end portion 4b of the first silicon nitride film 4 and the upper surface of the electrode pad 10.

As described, according to the fourth embodiment, water penetration from the moisture paths A, B, and C can be suppressed. Therefore, the corrosion of the ohmic electrode 8 by moisture can be suppressed, and the reliability of the semiconductor device can be enhanced.

If the wire 20 contacts with the third Ti layer 24, the exfoliation may happen in the third Ti layer 24 because of stress applied in the wire bonding process. In this case, moisture may penetrate into the boundary between the first silicon nitride film 4 and the electrode pad 10, and cause reliability degradation of the semiconductor device. Therefore, it is preferable that the wire 20 does not contact with the third Ti layer 24.

Although the description is given with the example where the polyimide layer 12 is used as a protective film provided on the semiconductor layer 2 and the first silicon nitride film 4 so as to cover the end portion of the first silicon nitride film 4, benzocyclobutene can be used as a protective film besides polyimide. The ohmic electrode 8 is composed of AuGe in embodiments, but may be composed of Ti and Au sequentially from the semiconductor layer 2 side. In addition, the electrode pad 10 is composed of Au in embodiments, but may be composed of the metal such as AuGe having high adhesion with Ti.

Figure 6:
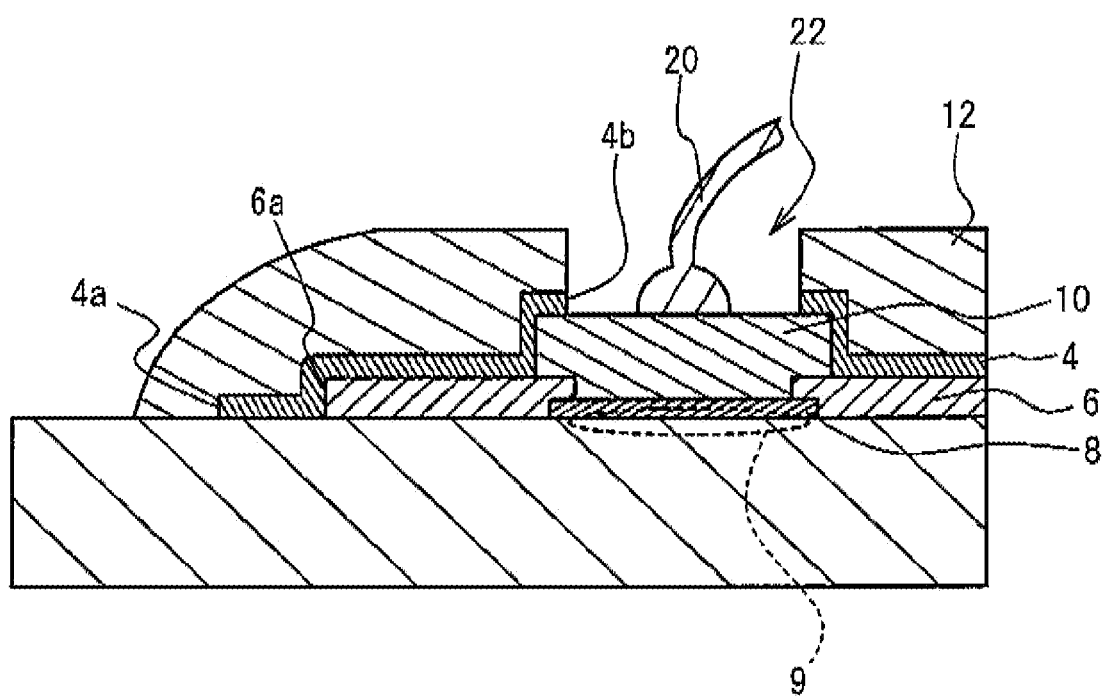
FIG. 6 is a cross section diagram illustrating a semiconductor device used for an experiment as a comparative example.

Now, a description will be given of the result of a moisture resistance test, Samples used for the test will be described first. FIG. 6 is a cross section diagram illustrating a semiconductor device used as a comparative example. As illustrated in FIG. 6, the first Ti layer 14 and the third Ti layer 24 are not provided to the semiconductor device in accordance with the comparative example. However, other compositions are same as compositions in FIG. 5A.

The samples are an FET (Field Effect Transistor) having the composition in FIG. 5A (the fourth embodiment), and an FET illustrated in FIG. 6A (the comparative example). In FIG. 5A and FIG. 6, the end portion of the semiconductor device is illustrated, but each electrode of the FET is not illustrated. In each sample, the thickness of the first silicon nitride film 4 is 600 nm, the thickness of the second silicon nitride film 6 is 1 μm, and the thickness of the polyimide layer 12 is 3 μm. In addition, the thickness of the first Ti layer 14 is 5 nm, the thickness of the third Ti layer 24 is 5 nm, and the thickness of the Au layer 18 is 4 μm. The length from the end portion of the polyimide layer 12 to the end portion 4a of the first silicon nitride film 4 is 3 μm, the length from the end portion 4a of the first silicon nitride film 4 to the end portion 6a of the second silicon nitride film 6 is 4 μm, the length where the first Ti layer 14 is in contact with the semiconductor layer is 2 μm, and the length where the second silicon nitride film 6 is in contact with the semiconductor layer 2 is 8 μm. The semiconductor layer 2 is composed of GaAs, and the ohmic electrode 8 is composed of AuGe. Now the test condition will be described.

Source-drain voltage VIAS of 28 V and gate-source voltage VGS of −2 V are impressed to each sample under the circumstance where temperature is 130° C. and humidity is 85%. After certain time passes under this condition, whether the ohmic electrode 8 peels off is tested by applying tensile stress to the wire 20 of each sample.

In the sample in accordance with the comparative example, the exfoliation of the ohmic electrode 8 happens after 20 hours has passed. This means that moisture that has penetrated corrodes the ohmic electrode 8 composed of AuGe, and the exfoliation happens in a region 9 illustrated with a dashed line in FIG. 6.

On the other hand, in the sample in accordance with the fourth embodiment, the exfoliation of the ohmic electrode 8 happens after more than 96 hours has passed. According to the fourth embodiment, the semiconductor device where the exfoliation of the ohmic electrode 8 does not happen for more than 96 hours, which is the level capable of applying to the production, can be obtained.

The present invention is not limited to the specifically described embodiments and variations but other embodiments and variations may be made without departing from the scope of the claimed invention.

What is claimed is:

1. A semiconductor device comprising:
   a semiconductor layer composed of one of GaAs-based semiconductor, InP-based semiconductor, and GaN-based semiconductor;
   a first silicon nitride film that is provided on the semiconductor layer, and of which an end portion is in contact with a surface of the semiconductor layer;
   a protective film that is composed of one of polyimide and benzocyclobutene, and is provided on the semiconductor layer and the first silicon nitride film, the protective film covering the end portion of the first silicon nitride film; and
   a first metallic layer that is composed of one of titanium, tantalum and platinum, and is continuously provided from a first portion located between the semiconductor layer and the protective film to a second portion located between the end portion of the first silicon nitride film and the protective film, the first metallic layer being partially in contact with the surface of the semiconductor layer and a surface of the end portion of the first silicon nitride film.

2. The semiconductor device according to claim 1, further comprising an Au layer provided on a surface of the first metallic layer.

3. The semiconductor device according to claim 1, further comprising:
   a second silicon nitride layer that is provided between the semiconductor layer and the first silicon nitride film, and of which an end portion is in contact with the surface of the semiconductor layer and covered with the first silicon nitride film; and
   a second metallic layer that is composed of one of titanium, tantalum and platinum, and is continuously provided from a third, portion located between the semiconductor layer and the first silicon nitride film to a fourth portion located between the first silicon nitride film and the end portion of the second silicon nitride film, the second metallic layer being partially in contact with the surface of the semiconductor layer and the surface of the end portion of the second silicon nitride film.

4. The semiconductor device according to claim 1, wherein an electrode pad is composed of Au, and a part of the electrode pad is provided between the semiconductor layer and the first silicon nitride film.

5. The semiconductor device according to claim 4, further comprising a third metallic layer that is composed of one of titanium, tantalum, and platinum, and is continuously provided from a surface of the electrode pad to a fifth portion located between the first silicon nitride film and the protective film, the third metallic layer being in contact with another end portion of the first silicon nitride film located on the electrode pad and being in contact with a surface of the electrode pad, wherein the electrode pad has an exposed portion which is exposed from the third metallic layer.

6. The semiconductor device according to claim 5, further comprising a wire that is bonded with the exposed portion of the electrode pad and is provided away from the third metallic layer.

* * * * *